(12) United States Patent
Matsuki et al.

(10) Patent No.: US 6,531,749 B1
(45) Date of Patent: Mar. 11, 2003

(54) FIELD EFFECT TRANSISTOR HAVING A TWO LAYERED GATE ELECTRODE

(75) Inventors: Takeo Matsuki, Tokyo (JP); Toshiki Shinmura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/453,459

(22) Filed: Dec. 2, 1999

(30) Foreign Application Priority Data

Dec. 2, 1998 (JP) .......................................... 10-342791

(51) Int. Cl.[7] ................................................ H01L 29/76
(52) U.S. Cl. ...................................... 257/388; 257/412
(58) Field of Search ................................ 438/586, 592, 438/643, 653, 687; 257/192, 369, 386, 388, 412, 413

(56) References Cited

U.S. PATENT DOCUMENTS

| | | | |
|---|---|---|---|
| 4,935,804 A | * 6/1990 | Ito et al. ......................... | 257/30 |
| 5,501,995 A | * 3/1996 | Shin et al. ...................... | 438/301 |
| 5,897,349 A | * 4/1999 | Agnello ......................... | 438/230 |
| 5,940,698 A | * 8/1999 | Gardner et al. ............... | 438/197 |
| 6,018,185 A | * 1/2000 | Mitani et al. ................. | 257/374 |
| 6,093,628 A | * 7/2000 | Lim et al. ...................... | 438/592 |
| 6,124,189 A | * 9/2000 | Watanabe et al. ............ | 438/586 |

FOREIGN PATENT DOCUMENTS

| | | |
|---|---|---|
| JP | 7-115196 | 5/1995 |
| JP | 7-273326 | 10/1995 |
| JP | 10-294462 | 11/1998 |
| JP | 11-87701 | 3/1999 |
| JP | 411087701 A | * 3/1999 |

* cited by examiner

Primary Examiner—Olik Chaudhuri
Assistant Examiner—Hoai Pham
(74) Attorney, Agent, or Firm—Young & Thompson

(57) ABSTRACT

A field effect transistor includes a lower gate electrode, upper gate electrode, first, second, and third barrier films, and source and drain. The lower gate electrode is formed from silicon on a silicon substrate via a gate insulating film. The upper gate electrode is formed from copper above the lower gate electrode. The first barrier film has a conductivity capable of supplying to the lower gate electrode a current enough to drive a channel portion, covers the lower surface of the upper gate electrode, and impedes diffusion of copper. The second barrier film has a lower end in contact with the first barrier film, covers the side surfaces of the upper gate electrode, and impedes diffusion of copper. The third barrier film has an end portion in contact with the second barrier film, covers the upper surface of the upper gate electrode, and impedes diffusion of copper. The source and drain are formed in the silicon substrate to sandwich a region under the lower gate electrode. A method of manufacturing the transistor is also disclosed.

2 Claims, 13 Drawing Sheets

FIELD EFFECT TRANSISTOR HAVING A TWO LAYERED GATE ELECTRODE

BACKGROUND OF THE INVENTION

The present invention relates to a field effect transistor having a gate electrode with a multilayered structure of silicon and copper, and a method of manufacturing the field effect transistor.

In recent years, further shrinkage in feature size of LSIs has been studied to increase the performance and degree of integration. For such shrinkage in feature size, the resistance of the gate electrode of a field effect transistor must be decreased to attain high performance. For this purpose, use of a two-layered structure of a metal and polysilicon for a gate electrode has been examined.

A gate electrode having a two-layered structure of polysilicon and copper has been proposed because of the low electrical resistance and better workability or chemical stability than that of gold or silver.

The conventional field effect transistor will be described. As shown in FIG. 6, first, a lower gate electrode 1403 of polysilicon is formed on a silicon substrate 1401 via a gate insulating film 1402. An upper gate electrode 1405 of copper is formed on the lower gate electrode 1403 via a barrier film 1404 of, e.g., titanium nitride. A barrier film 1406 of, e.g., titanium nitride is formed on the upper gate electrode 1405. The lower gate electrode 1403 and upper gate electrode 1405 form the gate electrode of the transistor.

A side wall 1407 of silicon oxide is formed to cover the side surface of the gate electrode. A lightly doped impurity region 1408 is formed in the silicon substrate 1401 under the side wall 1407. The silicon substrate 1401 has a source 1409 and drain 1410 which sandwich the lightly doped impurity region 1408.

The gate electrode comprising the lightly doped impurity region 1408, source 1409, drain 1410, gate insulating film 1402, and the gate electrode (comprising lower gate electrode 1403 and upper gate electrode 1405) form a field effect transistor having an LDD structure. This LDD structure suppresses the single channel effect.

This transistor is covered with an interlayer insulating film 1411 of silicon oxide. A gate electrode interconnection 1412 and source electrode interconnection 1413 formed from, e.g., aluminum are formed on the interlayer insulating film 1411. The gate electrode interconnection 1412 is connected to the upper gate electrode 1405 via the barrier film 1406 by a plug 1414 in the through hole formed in the interlayer insulating film 1411. The plug 1414 is formed from tungsten. A barrier film 1414a of, e.g., titanium nitride is formed on the side and bottom surfaces of the plug 1414.

The source electrode interconnection 1413 is connected to the source 1409 by a plug 1415 in the contact hole formed in the interlayer insulating film 1411. The plug 1415 is also formed from tungsten. A barrier film 1415a of, e.g., titanium nitride is formed on the side and button surfaces of the plug 1415.

Barrier films 1412a and 1413a of, e.g., titanium nitride are formed on the gate electrode interconnection 1412 and source electrode interconnection 1413, respectively. A protective insulating film 1416 is formed on the interlayer insulating film 1411 to cover the interconnections such as the gate electrode interconnection 1412 and source electrode interconnection 1413.

As described above, when the gate electrode has a two-layered structure of polysilicon and copper to reduce the resistance, the upper electrode 1405 of copper has the barrier films 1404 and 1406 on the lower and upper surfaces to suppress diffusion of copper to the lower polysilicon layer or upper metal interconnection formed from copper.

However, copper is diffused into the silicon oxide film and therefore diffused through the side wall 1407 and interlayer insulating film 1411, which are formed from silicon oxide. When copper is diffused to the silicon substrate 1401, a junction leakage current is generated, the ON current of the transistor is decreased, or the threshold value varies. When copper is diffused to the upper interconnection layer, a leakage current between the interconnection is generated.

SUMMARY OF THE INVENTION

It is therefore a principal object of the present invention to allow use of copper for the gate electrode of a field effect transistor without degrading the characteristics of the transistor.

In order to achieve the above object, according to the present invention, there is provided a field effect transistor comprising a lower gate electrode formed from silicon on a silicon substrate via a gate insulating film, an upper gate electrode formed from copper above the lower gate electrode, a first barrier film having a conductivity capable of supplying to the lower gate electrode a current enough to drive a channel portion and formed to cover a lower surface of the upper gate electrode and impede diffusion of copper, a second barrier film having a lower end in contact with the first barrier film and formed to cover side surfaces of the upper gate electrode and impede diffusion of copper, a third barrier film having an end portion in contact with the second barrier film and formed to cover an upper surface of the upper gate electrode and impede diffusion of copper, and a source and drain formed in the silicon substrate to sandwich a region under the lower gate electrode.

DESCRIPTION OF THE PREFERRED EMBODIMENTS

The embodiments of the present invention will be described below in detail with reference to the accompanying drawings.

First Embodiment

The first embodiment of the present invention will be described first.

Figure 1:
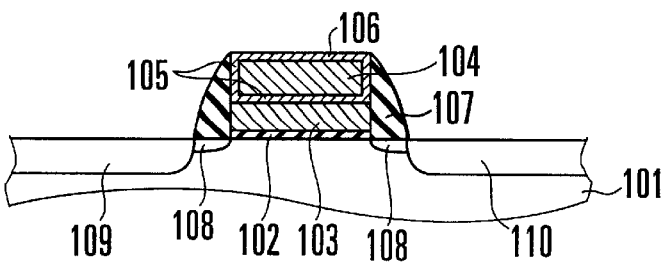
FIG. 1 is a sectional view schematically showing the structure of a field effect transistor according to the first embodiment of the present invention.

FIG. 1 shows the structure of a field effect transistor according to the first embodiment. In the field effect transistor of the first embodiment, first, a lower gate electrode 103 of polysilicon is formed on a silicon substrate 101 via a gate insulating film 102. An upper gate electrode 104 of copper is formed on the lower gate electrode 103. A barrier film (first and second barrier films) 105 of tantalum nitride is formed to cover the lower and side surfaces of the upper gate electrode 104. A barrier film (third barrier film) 106 is formed to cover the upper surface of the upper gate electrode 104. The upper gate electrode 104 has a cylindrical structure covered with the barrier films 105 and 106. The lower gate electrode 103 and upper gate electrode 104 form the gate electrode of the transistor.

A side wall 107 of silicon oxide is formed to cover the side surface of the gate electrode. A lightly doped impurity region 108 is formed in the silicon substrate 101 under the side wall 107. The silicon substrate 101 has a source 109 and drain 110 which sandwich the lightly doped impurity region 108.

The gate electrode comprising the lightly doped impurity region 108, source 109, drain 110, gate insulating film 102, lower gate electrode 103, and upper gate electrode 104 forms a field effect transistor having an LDD structure. This LDD structure suppresses the single channel effect.

As described above, in the field effect transistor of the first embodiment, the gate electrode has a multilayered structure of polysilicon and copper, so the resistance of the gate electrode can be reduced.

In the first embodiment, since not only the upper and lower surfaces but also the side surface of the copper portion of the gate electrode is covered with a barrier film, diffusion of copper via the silicon oxide film can be suppressed. As a consequence, the problems due to diffusion of copper, i.e., the junction leakage current and the decrease in ON current of the transistor can be solved.

A method of manufacturing the above-described field effect transistor of the first embodiment will be described next.

Figure 2A:
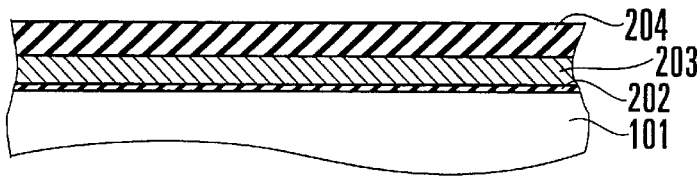
FIGS. 2A, 2B, 2C, 2D, 2E, 2F, 2G, 2H, 2I, 2J, 2K, 2L, 2M, 2N, 2O, 2P, 2Q, and 2R are sectional views for explaining a method of manufacturing the field effect transistor according to the first embodiment.

First, as shown in FIG. 2A, an insulating film 202 having a thickness of about 6 nm is formed on the silicon substrate 101 by dry oxidation. The insulating film 202 is a prospective gate insulating film. Subsequently, a polysilicon film 203 having a thickness of about 70 nm is formed on the insulating film 202 by low-pressure CVD. A silicon nitride film 204 having a thickness of about 100 nm is formed on the polysilicon film 203 by low-pressure CVD.

Figure 2B:
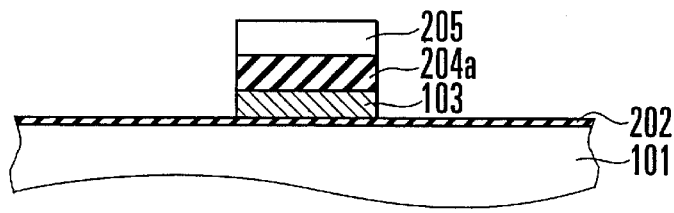

As shown in FIG. 2B, the silicon nitride film 204 and polysilicon film 203 are selectively removed by dry etching using a resist pattern 205 as a mask, thereby forming the lower gate electrode 103 and a sacrificial pattern 204a.

Figure 2C:
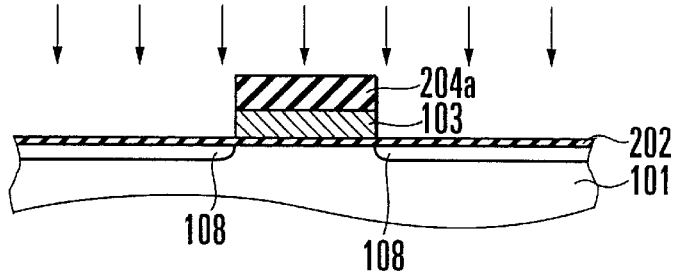

After the resist pattern 205 is removed, ions are selectively implanted using the sacrificial pattern 204a and lower gate electrode 103 as a mask to form the lightly doped impurity region (LDD) 108, as shown in FIG. 2C. In this case, As ions are implanted at an acceleration energy of 20 eV and a dose of about $3 \times 10^{13}$ cm$^{-2}$.

Figure 2D:
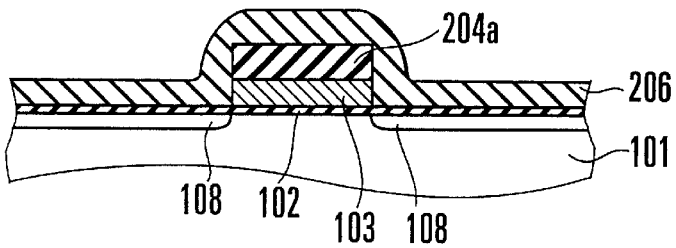
Figure 2E:
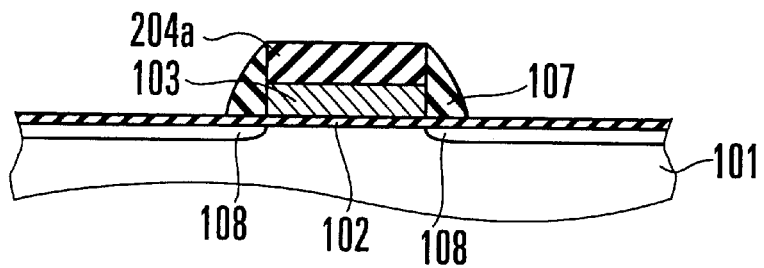

As shown in FIG. 2D, a silicon oxide film 206 is formed on the entire surface. To do this, silicon oxide is deposited by low-pressure CVD using TEOS as a source gas.

Figure 3A:
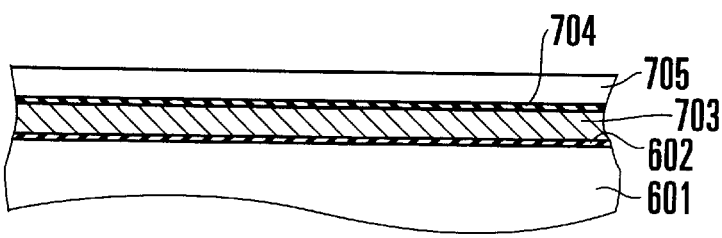
FIGS. 3A, 3B, 3C, 3D, 3E, 3F, 3G, 3H, 3I, 3J, 3K, 3L, 3M, 3N, 3O, 3P, and 3Q are sectional views for explaining a method of manufacturing a field effect transistor according to the second embodiment of the present invention.
Figure 3B:
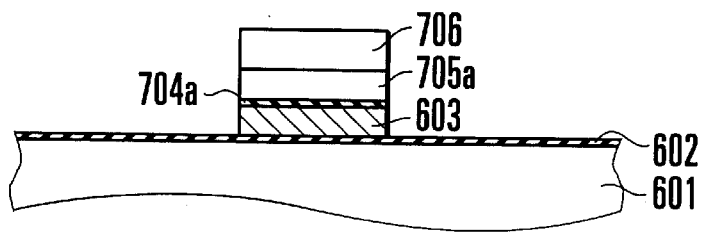
Figure 3C:
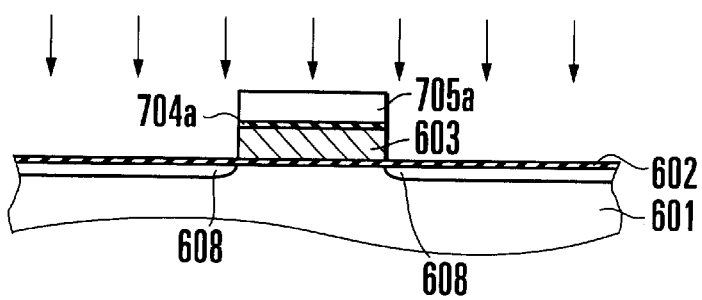
Figure 3D:
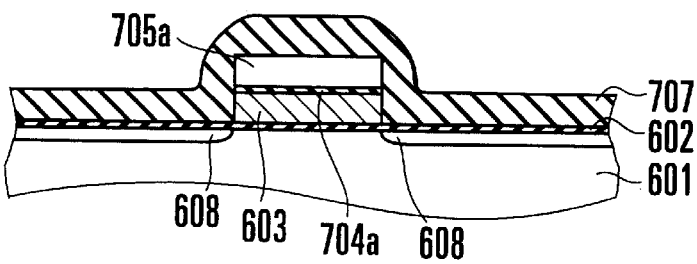
Figure 3E:
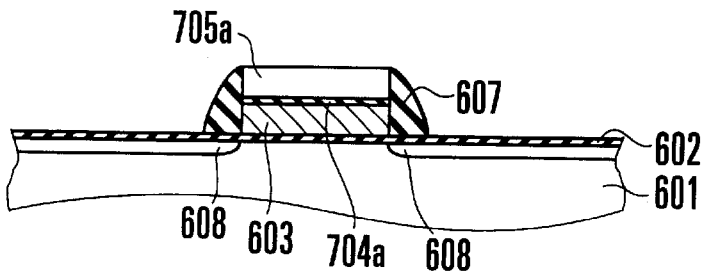
Figure 3F:
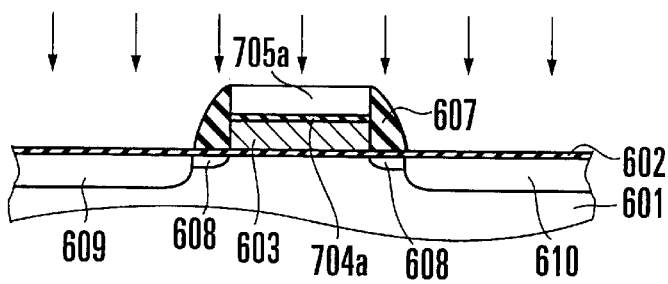

The silicon oxide film 206 is etched back by reactive ion etching (RIE) having vertical anisotropy to form the side wall 107 on the side surfaces of the lower gate electrode 103 and sacrificial pattern 204a, as shown in FIG. 3E.

Figure 2F:
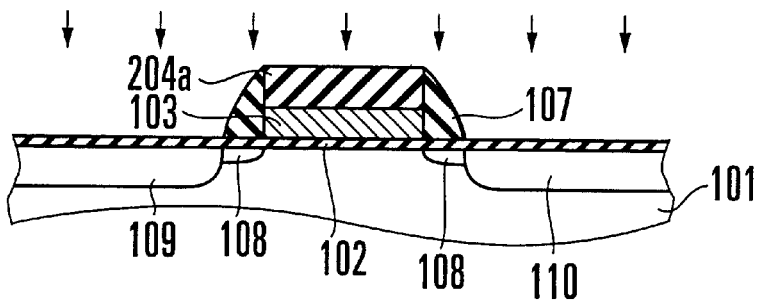

Next, as shown in FIG. 2F, ions are selectively implanted using the sacrificial pattern 204a, lower gate electrode 103, and side wall 107 as a mask to form the source 109 and drain 110. In this case, As ions are implanted at an acceleration energy of 30 eV and a dose of about $3 \times 10^{15}$ cm$^{-2}$.

Figure 2G:
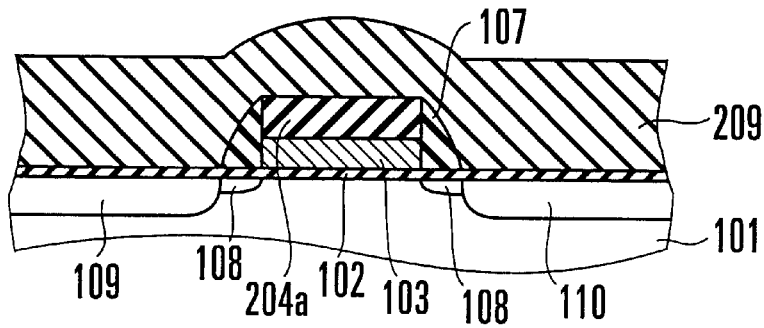

Borophosphosilicate glass is deposited by CVD using ozone and TEOS as source gases to form a lower interlayer insulating film 209 having a thickness of about 500 nm, as shown in FIG. 2G.

Figure 2H:
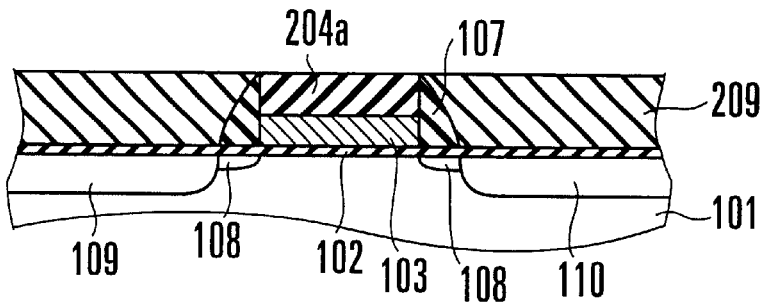

The lower interlayer insulating film 209 is planarized by oxide film CMP (Chemical Mechanical Polishing) to expose the upper surface of the sacrificial pattern 204a, as shown in FIG. 2H.

Figure 2I:
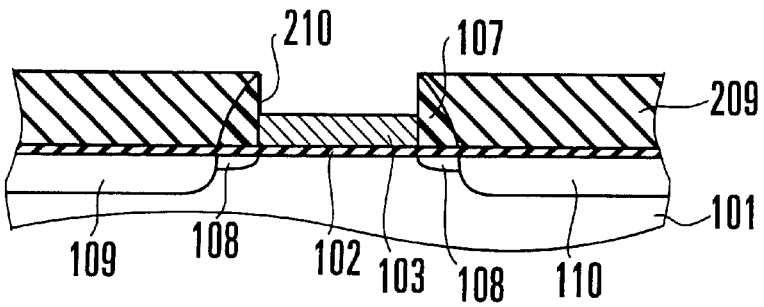

Only the sacrificial pattern 204a is selectively removed by wet etching using hot phosphoric acid to form a trench 210 surrounded by the side wall 107 and lower interlayer insulating film 209 on the lower gate electrode 103, as shown in FIG. 2I. Since wet etching using hot phosphoric acid rarely etches silicon or silicon oxide, only the sacrificial pattern 204a of silicon nitride can be selectively removed.

In the above-described first embodiment, the upper surface of the sacrificial pattern 204a is exposed by removing the lower interlayer insulating film 209 by CMP. The upper surface of the sacrificial pattern 204a may be exposed by the following technique. For example, when a material such as borosilicate glass that can be planarized by reflow is used, the lower interlayer insulating film may be planarized by reflow and then removed by, e.g., dry etching. Not only borosilicate glass but also borophosphosilicate glass (BPSG) can be used as the lower interlayer insulating film.

Alternatively, an SOG (Spin On Glass) material may be used as the lower interlayer insulating film. After the SOG material is applied and planarized, the planarized coat is etched back by, e.g., dry etching to expose the upper surface of the sacrificial pattern 204a. When the technique of planarizing the lower interlayer insulating film using CMP or an SOG material and then etching back the layer is to be used, the lower interlayer insulating film need not always be formed from silicate glass, and a silicon oxide or normal silicon film or silicon nitride film formed by CVD can be used.

Figure 2J:
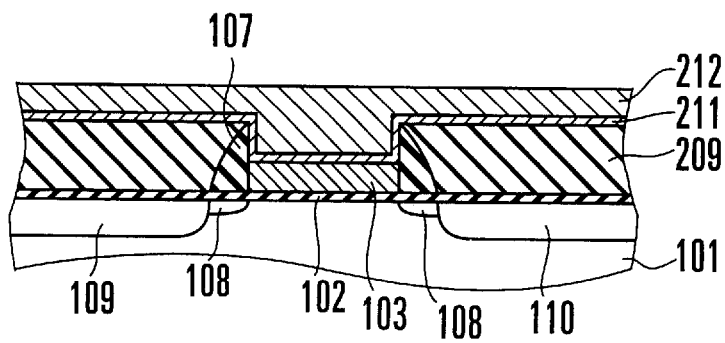

As shown in FIG. 2J, a tantalum nitride film is deposited on the lower interlayer insulating film 209, including the bottom and side surfaces of the trench 210, by sputtering to form a TaN film 211 having a thickness of about 10 nm. Subsequently, copper is deposited on the TaN film 211 to form a Cu layer 212 having a thickness of about 200 nm.

Figure 2K:
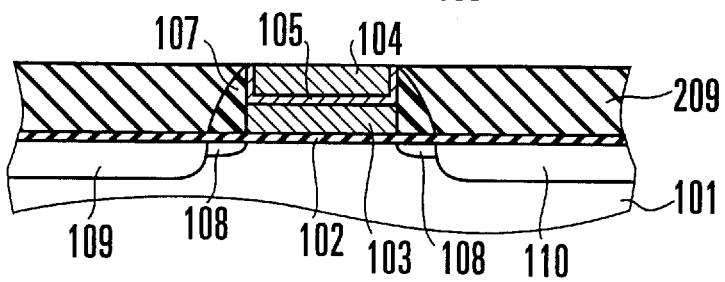

The Cu layer 212 and TaN film 211 are removed by, e.g., metal film CMP to form, in the trench 210, the upper gate electrode 104 formed from copper and having lower and side surfaces covered with the barrier film 105 of tantalum nitride, as shown in FIG. 2K. The surface of the lower interlayer insulating film 209 other than that of the upper gate electrode 104 is exposed.

Figure 2L:
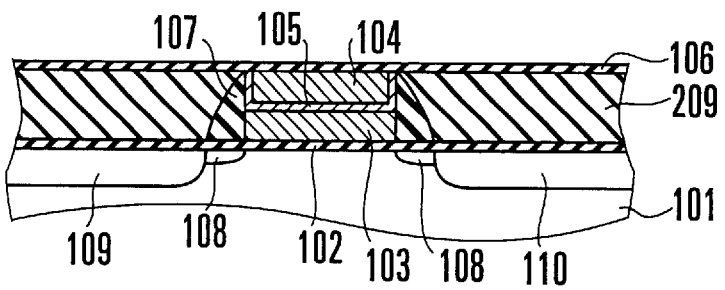

As shown in FIG. 2L, the about 10-nm thick barrier film 106 of silicon nitride is formed on the entire surface. To do this, silicon nitride is deposited by plasma CVD. Alternatively, boron nitride may be an insulating material used as the third barrier film 106.

With the above processes, a field effect transistor having a gate electrode constructed by the lower gate electrode 103 of polysilicon and the upper gate electrode 104 of copper, which is surrounded by the barrier films 105 and 106, is formed.

The barrier film 106 need not be formed on the lower interlayer insulating film 209. As shown in FIG. 1, the barrier film 106 may be formed in only a region where the barrier film 106 covers the upper gate electrode 104. In this case, since the barrier film 106 is not present on the lower interlayer insulating film 209, the barrier film 106 may be formed from, e.g., tantalum nitride having the same conductivity type as that of the barrier film 105.

Figure 2M:
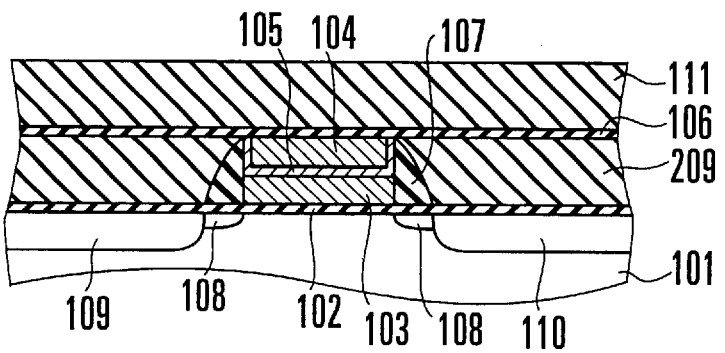

After this, an interlayer insulating film 111 having a thickness of about 500 nm is formed on the barrier film 106 using silicon oxide (BPSG) containing boron and phosphorus, as shown in FIG. 2M. This film is formed by CVD using oxygen gas and TEOS as source gases.

Figure 2N:
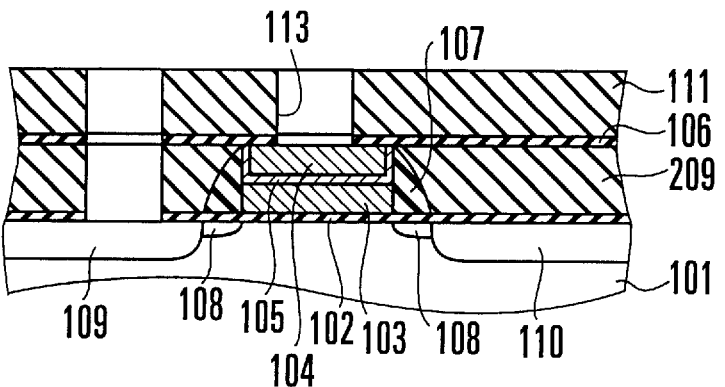

As shown in FIG. 2N, a contact hole 112 and through hole 113 are formed. These holes are formed by anisotropic dry etching using, as a mask, a resist pattern formed by known photolithography. The source 109 in the silicon substrate 101 is exposed to the bottom surface of the contact hole 112. The upper surface of the upper gate electrode 104 is exposed to the bottom surface of the through hole 113.

Figure 2O:
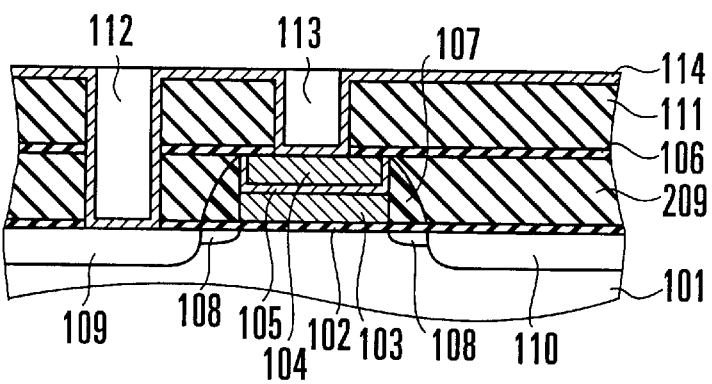

Next, as shown in FIG. 2O, a barrier film 114 having a two-layered structure of titanium nitride and titanium is formed on the interlayer insulating film 111, including the side and bottom surfaces of the contact hole 112 and through hole 113. The barrier film 114 is formed by CVD, and the titanium nitride film and titanium film are about 50 and 10 nm thick, respectively.

Figure 2P:
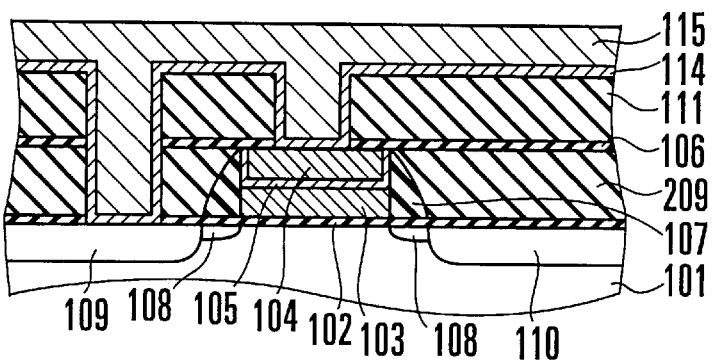

Subsequently, as shown in FIG. 2P, a 400-nm thick W film 115 of tungsten is formed on the barrier film 114 by, e.g., low-pressure CVD.

Figure 2Q:
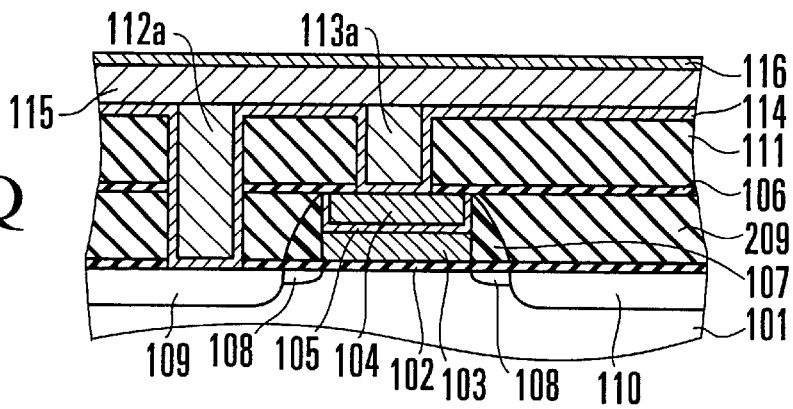

The W film 115 is removed by, e.g., dry etching such that the contact hole 112 and through hole 113 are kept filled with the W film. With this process, plugs 112a and 113a are formed (FIG. 2Q). After that, a 500-nm thick alloy film 115a of an aluminum-copper alloy containing about 1% copper is formed by sputtering. In addition, a 30-nm thick barrier film 116 of titanium nitride is formed by sputtering.

Figure 2R:
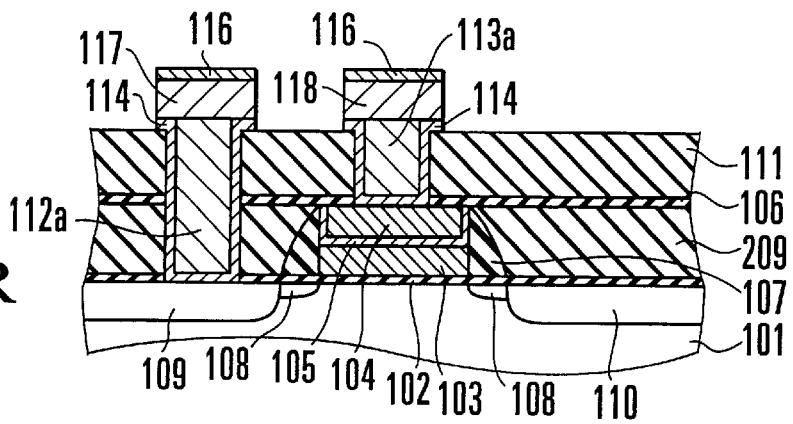

When the alloy film 115a and barrier films 114 and 116 are patterned, a source electrode interconnection 117 and gate electrode interconnection 118 are formed, as shown in FIG. 2R.

With the above manufacturing method, the upper gate electrode of copper is formed after formation of the source and drain. That is, the upper gate electrode is formed after the high-temperature annealing for activation for forming the source and drain. Hence, the upper gate electrode can be formed using copper having a relatively low melting point.

In the first embodiment, tantalum nitride is used to form the barrier film (first and second barrier films) 105. However, the present invention is not limited to this. A nitride (a compound of a refractory metal, silicon, and nitrogen) such as titanium nitride, tungsten nitride, tantalum nitride, molybdenum nitride, nitride of titanium silicide, or nitride of tungsten silicide, or a metal material such as tantalum or titanium-tungsten may be used.

As the above-described barrier films (first to third barrier films), a material that contains no oxygen and has a function of impeding diffusion of copper may be used. Since the upper gate electrode is formed from copper, oxidation of copper can be suppressed using a material containing no oxygen.

As the barrier film (first barrier film) on the lower surface of the upper gate electrode, silicon nitride may be used. This barrier film only need have a conductivity that supplies to the lower gate electrode a current enough to drive the channel portion. For this reason, a silicon nitride film can be used as far as it has a thickness enough to allow the tunnel current to flow. In this case, the barrier film can be formed by nitriding the surface of the lower gate electrode to, e.g., about 2 nm.

The barrier film (second barrier film) formed on the side surface of the upper electrode of copper and the barrier film (first barrier film) formed between the upper electrode and the lower electrode may be a multilayered film having two or more layers. In diffusion in a solid-state material, the diffusion species readily precipitates to the interface or grain boundary (when the film is polycrystalline) of the solid-state material. When the barrier film is formed as a multilayered film, a small amount of copper diffused to the interface between films can be captured, and diffusion of the diffusion species can be more effectively prevented. The multilayered film is preferably formed from refractory metals or a composite film of refractory metals. For example, a composite film of Ta and TaN can be used. A metal such as copper is rarely diffused into a thermally stable metal nitride. When a nitride film of a refractory metal is used as the barrier film, the number of point defects decreases, and diffusion of copper via the point defects can be suppressed.

When a refractory metal silicide is formed in contact with the lower electrode of silicon as part of the first barrier film having a multilayered structure, the operation performance of the field effect transistor can be effectively improved. This is because formation of any Schottky barrier is suppressed and contact resistance is reduced at the interface between a silicide and silicon. When the first barrier film having a multilayered structure includes a film formed from a refractory metal, that is in contact with copper, the adhesion between copper and the first barrier film can be effectively improved.

To form a compound of a refractory metal, silicon, and nitrogen in contact with the lower electrode of silicon as part of the first barrier film having a multilayered structure is also effective to improve the yield of device manufacturing. This is because the compound has good adhesion with silicon. Such compound is formed by, e.g., forming a tungsten nitride film in the trench by CVD, reactive collimation sputtering, or the like and annealing the film at a temperature of about 500° C. Since the compound is formed by reaction between silicon and the refractory metal, adhesion with silicon is improved.

Second Embodiment

The second embodiment of the present invention will be described next.

A method of manufacturing a field effect transistor of the second embodiment will be described first.

As shown in FIG. 3A, a gate insulating film 602 having a thickness of about 6 nm is formed on a silicon substrate 601 by dry oxidation. A polysilicon film 703 having a thickness of about 50 nm and doped with an n-type impurity is formed on the gate insulating film 602 by low-pressure CVD. A silicon oxide film 704 having a thickness of about 10 nm is formed on the polysilicon film 703 by CVD. A polysilicon film 705 having a thickness of about 100 to 300 nm is formed on the silicon oxide film 704 by CVD.

As shown in FIG. 3B, the polysilicon film 705, silicon oxide film 704, and polysilicon film 703 are selectively removed by dry etching using a resist pattern 706 as a mask to form a lower gate electrode 603, etching stopper layer 704a, and sacrificial pattern 705a.

After the resist pattern 706 is removed, ions are selectively implanted using the sacrificial pattern 705a and lower gate electrode 603 as a mask to form a lightly doped impurity region (LDD) 608, as shown in FIG. 3C. In this case, As ions are implanted at an acceleration energy of 20 eV and a dose of $1 \times 10^{13}$ cm$^{-2}$.

As shown in FIG. 3D, a silicon oxide film 707 is formed on the entire surface. To do this, silicon oxide is deposited by low-pressure CVD using TEOS as a source gas.

The silicon oxide film 707 is etched back by reactive ion etching (RIE) having vertical anisotropy to form a side wall 607 on the side surfaces of the lower gate electrode 603 and sacrificial pattern 705a, as shown in FIG. 3E. This side wall 607 may be formed from silicon nitride. The silicon nitride film can be formed like the silicon oxide film.

Next, ions are selectively implanted using the sacrificial pattern 705a, lower gate electrode 603, and side wall 607 as a mask to form a source 609 and drain 610. In this case, As ions are implanted at an acceleration energy of 30 eV and a dose of about $2\times10^{15}$ cm$^{-2}$. The impurity-doped region formed by ion implantation is heated in, e.g., a nitrogen atmosphere at 800° C. for 10 min and at 1,000° C. for 10 sec to reduce defects and activate the impurity.

Figure 3G:
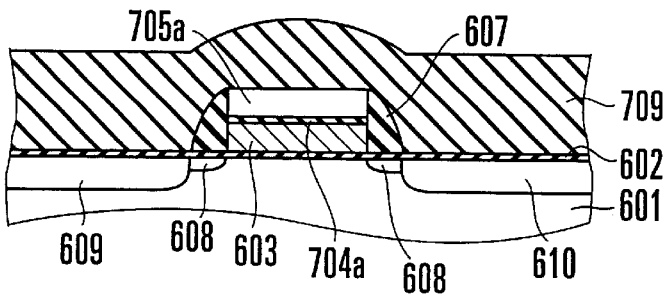

Borophosphosilicate glass is deposited by CVD using ozone and TEOS as source gases. The BPSG is heated and reflowed to form a lower interlayer insulating film 709 having a thickness of about 400 to 600 nm, as shown in FIG. 3G.

Figure 3H:
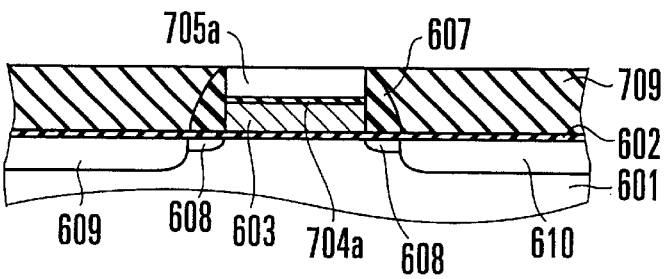

The lower interlayer insulating film 709 is removed by a predetermined thickness by oxide film CMP (Chemical Mechanical Polishing) to expose the upper surface of the sacrificial pattern 705a, as shown in FIG. 3H.

Figure 3I:
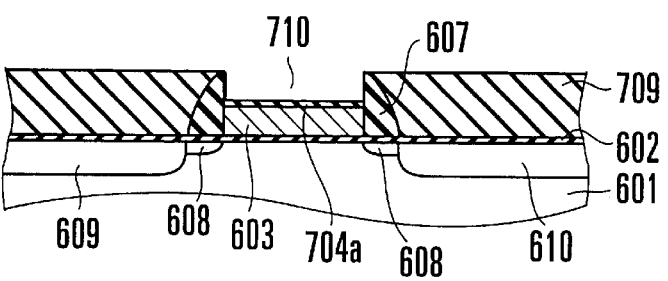

Only the sacrificial pattern 705a is selectively removed by reactive ion etching with a high selectivity to the oxide film to form a trench 710 surrounded by the side wall 607 and lower interlayer insulating film 709 on the lower gate electrode 603, as shown in FIG. 3I.

Figure 3J:
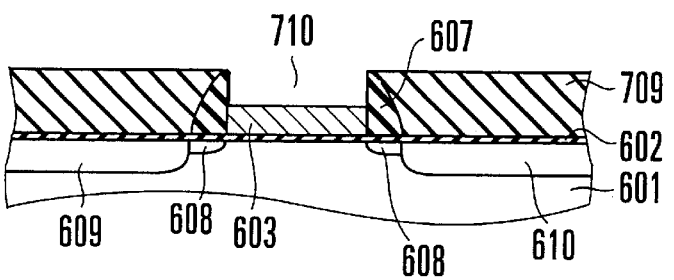

As shown in FIG. 3J, the etching stopper layer 704a is removed by etching with selectivity to silicon oxide to expose the upper surface of the lower gate electrode 603 to the bottom surface of the trench 710.

Figure 3K:
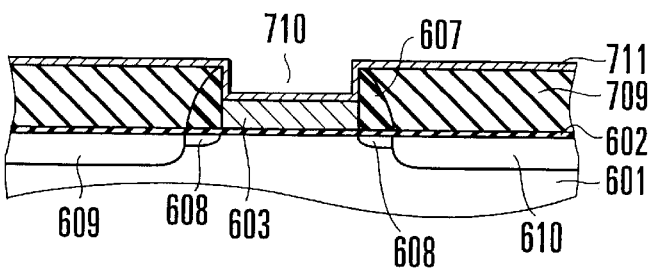
Figure 3L:
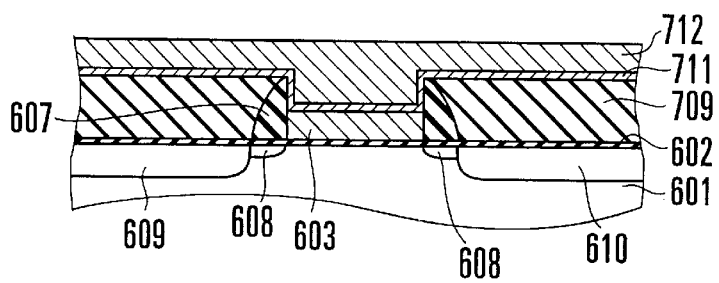

Next, as shown in FIG. 3K, a tantalum nitride film is deposited on the lower interlayer insulating film 709, including the bottom and side surfaces of the trench 710, by sputtering to form a TaN film 711 having a thickness of about 10 nm. As shown in FIG. 3L, copper is deposited on the TaN film 711, and the deposited copper is heated and reflowed to form a Cu layer 712 having a flat surface and a thickness of about 100 to 500 nm.

In place of the TaN. film 711, a thin film of titanium nitride, tantalum, tungsten nitride, or titanium-tungsten may be used. The Cu layer 712 may be formed by electroplating or CVD.

Figure 3M:
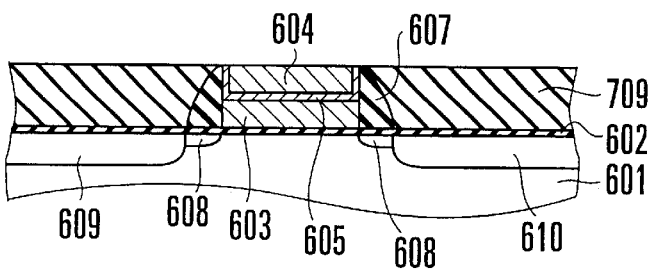

Next, the Cu layer 712 and TaN film 711 are removed by, e.g., metal film CMP to form an upper gate electrode 604 of copper, whose lower and side surfaces are covered with a barrier film 605 of tantalum nitride, as shown in FIG. 3M. The surface of the lower interlayer insulating film 709 other than that of the upper gate electrode 604 is exposed. In place of the TaN film 711, a multilayered structure of a refractory metal and refractory metal nitride, such as TaN/Ta or Ta/TaN/Ta may be formed.

When collimation sputtering is used to form the multi-layered film, any increase in layer resistance can be suppressed even when the layer resistance of the gate electrode and the trench width decrease. According to collimation sputtering, particles sputtered from the material target by a plasma, which contribute to film formation, are incident on the substrate almost vertically through a collimator. For this reason, the film formed on the side surface of the trench becomes thinner than that formed on the bottom surface. When the resistivity of the barrier film material is higher than that of copper, and the film on the side surface is thick, the resistance increases in proportion to the film thickness. When the trench width becomes small, the layer resistance increases. Hence, the film formed on the side wall in the trench is preferably made thin using collimation sputtering.

The same effect as described above can be obtained by ionization sputtering. In this ionization sputtering, ionized material particles ionized by a bias voltage applied to the substrate are made incident on the substrate almost at 90 degrees and deposited to form a film by a bias voltage applied to the substrate. With this method as well, the film formed on the side wall in the trench can be made thin.

Figure 3N:
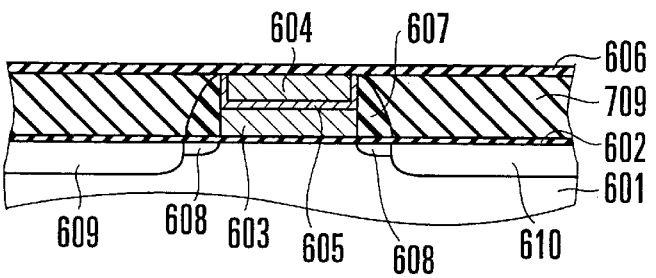

As shown in FIG. 3N, a 10- to 100-nm thick barrier film 606 of titanium oxide or silicon nitride is formed on the entire surface. The barrier film is formed by, e.g., reactive sputtering.

With the above processes, a field effect transistor having a gate electrode constructed by the lower gate electrode 603 of polysilicon and the upper gate electrode 604 of copper, which is surrounded by the barrier films 605 and 606, is formed.

The barrier film 606 need not be formed on the lower interlayer insulating film 709. The barrier film 606 may be formed in only a region where the barrier film 606 covers the upper gate electrode 604. In this case, since the barrier film 606 is not present on the lower interlayer insulating film 709, the barrier film 606 may be formed from, e.g., tantalum nitride, like the barrier film 605.

Figure 3O:
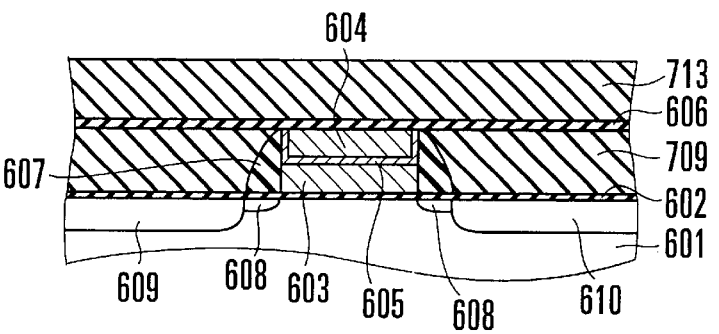

After this, an interlayer insulating film 713 having a thickness of about 100 to 500 nm is formed on the barrier film 606 using silicon oxide (BPSG) containing boron and phosphorus, as shown in FIG. 3O. This film is formed by CVD using oxygen gas and TEOS as source gases.

Figure 3P:
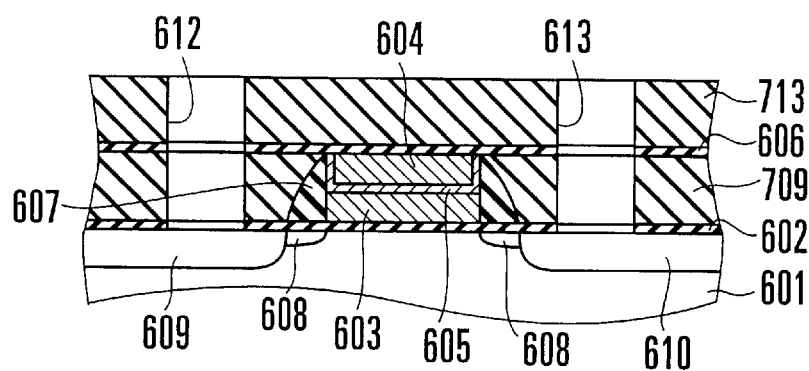

As shown in FIG. 3P, contact holes 612 and 613 are formed. These holes are formed by anisotropic dry etching using, as a mask, a resist pattern formed by known photo-lithography. The source 609 in the silicon substrate 601 is exposed to the bottom surface of the contact hole 612. The drain 610 in the silicon substrate 601 is exposed to the bottom surface of the contact hole 613.

Figure 3Q:
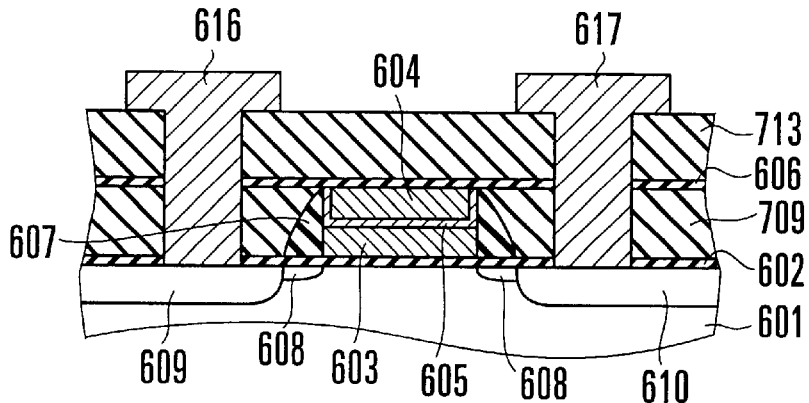

Next, as shown in FIG. 3Q, a source electrode interconnection 616 and drain electrode interconnection 617 of, e.g., aluminum are formed via the contact holes 612 and 613.

In the second embodiment as well, since the gate electrode has a multilayered structure of polysilicon and copper, the resistance of the gate electrode can be reduced.

In the second embodiment as well, since not only the upper and lower surfaces but also the side surface of the copper portion of the gate electrode is covered with a barrier film, diffusion of copper via the silicon oxide film can be suppressed. As a consequence, the problems due to diffusion of copper, i.e., the junction leakage current and the decrease in ON current of the transistor can be solved.

In the second embodiment as well, the upper gate electrode of copper is formed after formation of the source and drain. That is, the upper gate electrode is formed after the high-temperature annealing for activation for forming the source and drain. Hence, the upper gate electrode can be formed using copper having a relatively low melting point.

The side wall may be formed from silicon nitride. When the side wall is formed using a material such as silicon nitride capable of impeding diffusion of copper, the side wall can be used as a barrier film (second barrier film) arranged on the side surface of the above-described upper gate electrode.

In this case, a barrier film need not be separately formed on the side surface of the upper gate electrode. More specifically, instead of depositing a tantalum nitride film on the lower interlayer insulating film 209, including the bottom and side surfaces of the trench 210, by sputtering, as shown in FIG. 2J, the first barrier film is formed by nitriding the upper portion of the lower electrode 103 to about 2 nm. As described above, since a tunnel current flows through a silicon nitride film as thin as about 2 nm, electrical connection to the upper gate electrode has no disadvantage.

Instead of nitriding the upper portion of the lower electrode 103, a material having another conductivity type and capable of impeding diffusion of copper may be formed on the lower electrode 103.

When the upper gate electrode 104 is formed on the first barrier film, the lower and side surfaces of the upper gate electrode 104 are covered with silicon nitride that impedes diffusion of copper. With the processes from FIG. 2L, the field effect transistor according to the present invention can be obtained.

When the side wall is formed using a material such as silicon nitride that is difficult to etch under a predetermined etching condition as compared to silicon oxide, the interconnection can be easily connected to the upper electrode. The reason for this is as follows. A contact hole is formed in the interlayer insulating film formed on the upper electrode, and an interconnection is connected to the upper electrode through the contact hole. When forming the contact hole, silicon nitride is rarely etched by etching the interlayer insulating film of silicon oxide. For this reason, even when the contact hole formation position slightly shifts, the side wall is hard to be not etched off.

In the above-described method, the underlying layers are processed using the resist pattern 706 as a mask, as shown in FIG. 3B. However, the present invention is limited to this. The underlying layers may be processed using a hard mask of silicon oxide. When a hard mask is used, a refractory metal silicide can be selectively formed in the source and drain regions.

Figure 4A:
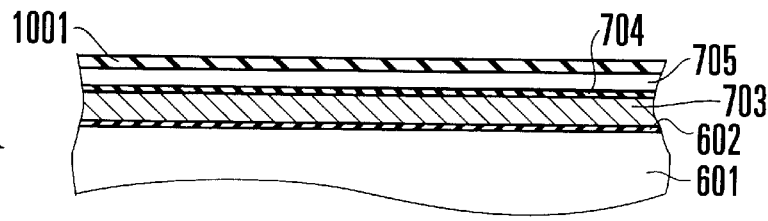
FIGS. 4A, 4B, 4C, 4D, 4E, 4F, 4G, 4H, and 4I are sectional views for explaining another method of manufacturing the field effect transistor of the present invention.

First, as shown in FIG. 4A, a gate insulating film 602 having a thickness of about 6 nm is formed on a silicon substrate 601. A polysilicon film 703 having a thickness of about 50 nm and doped with an n-type impurity is formed on the gate insulating film 602 by low-pressure CVD. A silicon oxide film 704 having a thickness of about 10 nm is formed on the polysilicon film 703 by CVD. A polysilicon film 705 having a thickness of about 100 to 300 nm is formed on the silicon oxide film 704 by CVD. In addition, a silicon oxide film 1001 is formed on the polysilicon film 705. In place of the silicon oxide film, a silicon nitride film may be formed.

Figure 4B:
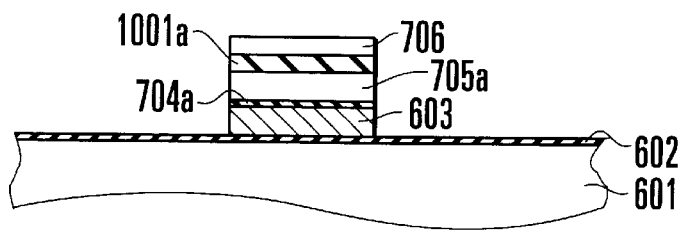

The polysilicon film 705, silicon oxide film 704, polysilicon film 703, and silicon oxide film 1001 are selectively removed by dry etching using the resist pattern 706 as a mask to form a lower gate electrode 603, etching stopper layer 704a, and sacrificial pattern 705a, and also a hard mask 1001a, as shown in FIG. 4B.

Figure 4C:
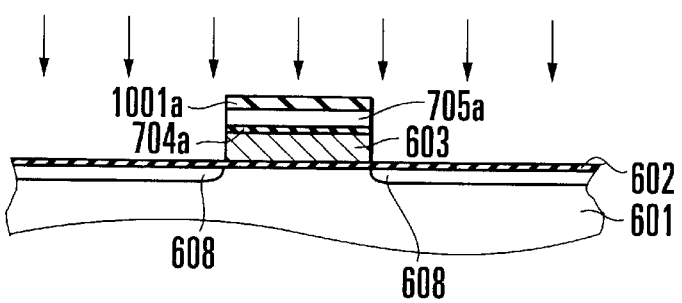

After the resist pattern 706 is removed, ions are selectively implanted using the hard mask 1001a, sacrificial pattern 705a, and lower gate electrode 603 as a mask to form a lightly doped impurity region (LDD) 608, as shown in FIG. 4C. The LDD 608 is formed by implanting As ions at an acceleration energy of 20 eV and a dose of about $1\times10^{13}$ cm$^{-2}$.

Figure 4D:
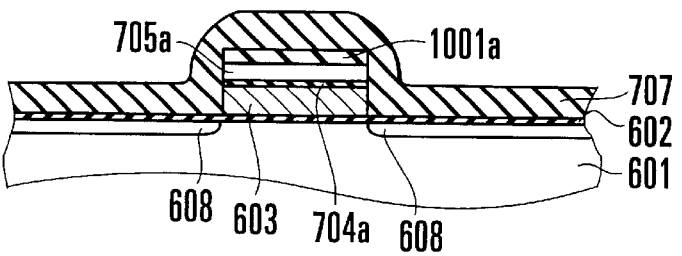
Figure 4E:
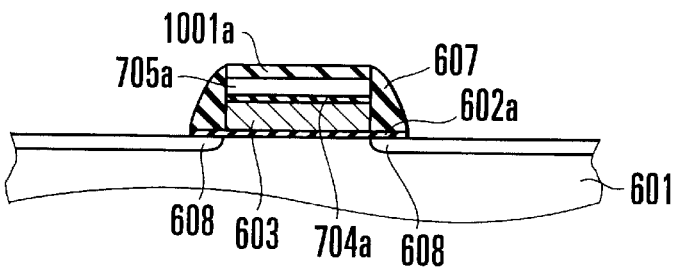

As shown in FIG. 4D, silicon oxide is deposited by low-pressure CVD using TEOS as a source gas to form a silicon oxide film 707 on the entire surface. The silicon oxide film 707 is etched back by reactive ion etching (RIE) having vertical anisotropy to form the side wall 607 on the side surfaces of the lower gate electrode 603 and sacrificial pattern 705a, as shown in FIG. 4E. Simultaneously, a region of the gate insulating film 602, which is not covered with the lower gate electrode 603 and side wall 607, is removed. The side wall 607 may be formed from silicon nitride. The silicon nitride film can be formed like the silicon oxide film.

Next, ions are selectively implanted using the sacrificial pattern 705a, lower gate electrode 603, side wall 607, and hard mask 1001a as a mask to form a source 609 and drain 610. In this case, As ions are implanted at an acceleration energy of 30 eV and a dose of about $2\times10^{15}$ cm$^{-2}$. The impurity-doped region formed by ion implantation is annealed in, e.g., a nitrogen atmosphere at 800° C. for 10 min and at 1,000° C. for 10 sec to reduce defects and activate the impurity.

Figure 4F:
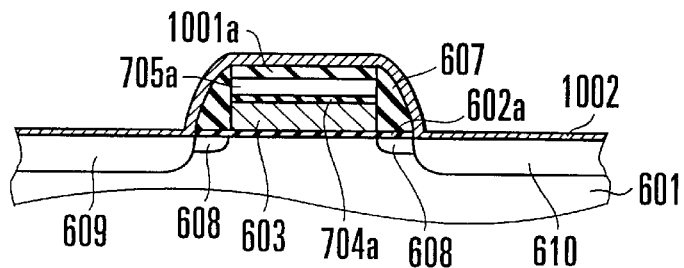

Since the hard mask 1001a is used, no silicide is formed on the sacrificial pattern 705a of silicon, and a silicide can be formed on the surface in the source and drain regions in a self-aligned manner. As shown in FIG. 4F, a 10- to 20-nm thick cobalt film is formed on the entire surface by, e.g., sputtering to form a refractory metal film 1002. The resultant structure is annealed by RTA (Rapid Thermal Anneal) to cause the underlying silicon layer (silicon substrate 601) to react with the refractory metal film 1002, thereby selectively forming a silicide 1003 on the source 609 and drain 610, as shown in Fig. 11G. This silicide is preferably formed at a temperature of 650° C. to 750° C. The atmosphere of annealing is preferably an inert atmosphere of nitrogen, argon, or the like.

Figure 4G:
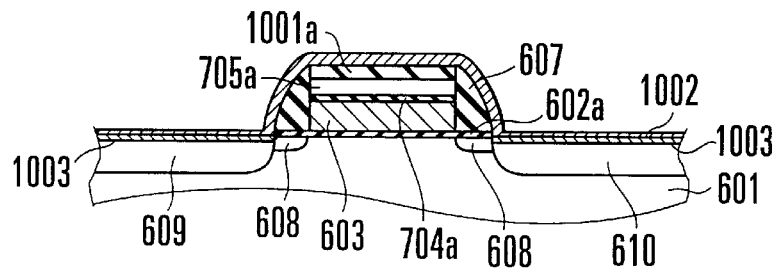
Figure 4H:
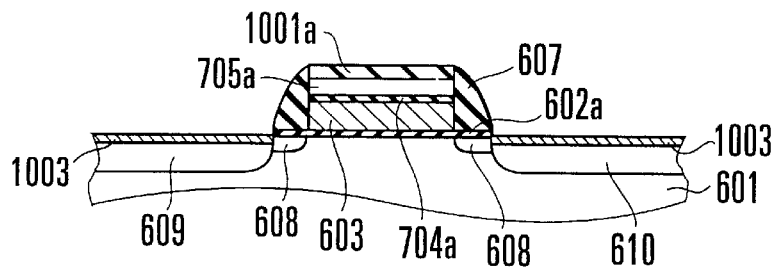

After the silicide is formed, the underlying silicon and unreacted cobalt are selectively removed by wet etching using a mixed solution of chloric acid, hydrogen peroxide, and water, as shown in FIG. 4H. When the annealing is performed in a nitrogen atmosphere, cobalt nitride is formed. This cobalt nitride is also selectively removed by wet etching using a solution mixture of hydrochloric acid, hydrogen peroxide, and water. After this, the structure is annealed at 750° C. to 850° C. by RTA again to reduce the resistance of the silicide. As the refractory metal, not cobalt but titanium (10 to 30 nm) may be used. When titanium is used, wet etching using a solution mixture of ammonia, hydrogen peroxide, and water is performed to remove excess titanium or titanium nitride after the silicide process.

When the silicide is selectively formed in the source and drain regions, a lower interlayer insulating film 709 having a thickness of about 400 to 600 nm is formed, as in FIG. 3G. After this, the lower interlayer insulating film 709 is removed by a predetermined thickness by oxide film CMP (Chemical Mechanical Polishing). Simultaneously, the hard mask 1001a is also removed to expose the upper surface of the sacrificial pattern 705a.

Figure 4I:
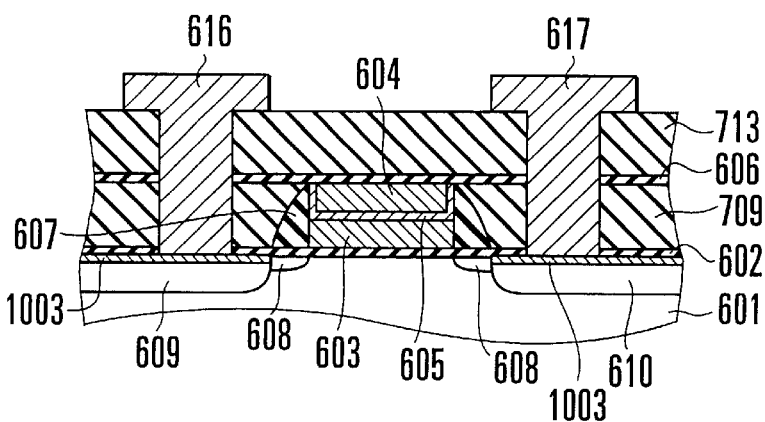

With the same processes as in FIGS. 3H to 3Q, the structure shown in FIG. 3Q added with the silicide 1003 is obtained, as shown in FIGS. 4I. Since the silicide 1003 is selectively formed on the source 609 and drain 610, the contact resistances of the source electrode interconnection 616 and drain electrode interconnection 617 can be reduced.

The silicide formation may be applied to the field effect transistor of the first embodiment. For example, when the side wall 107 shown in FIG. 3E is to be formed, the gate insulating film 102 is simultaneously removed in correspondence with the source and drain to expose the surface of the silicon substrate 101 in correspondence with the source and drain. After this, as in FIG. 2F, the source 109 and drain 110 are formed. When a refractory metal film of, e.g., cobalt or titanium is formed on the entire surface, a silicide can be selectively formed on the source and drain, as in FIGS. 4F to 4H. In the first embodiment, since the sacrificial pattern 204a is formed from silicon nitride, and the side wall 107 is formed from silicon oxide, no silicide is formed thereon. When the side wall surface or sacrificial pattern surface hardly reacts with the refractory metal, the silicide can be easily selectively formed on the source and drain.

A method of manufacturing a field effect transistor in which the above-described side wall is used as the second barrier film will be described next.

Figure 5A:
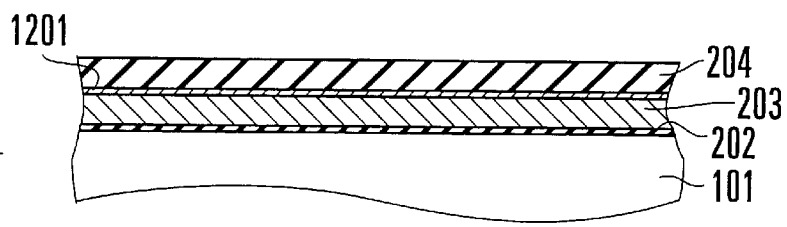
FIGS. 5A, 5B, 5C, 5D, 5E, 5F, 5G, 5H, 5I, 5J, and 5K are sectional views for explaining still another method of manufacturing the field effect transistor of the present invention.

As shown in FIG. 5A, an insulating film 202 having a thickness of about 6 nm is formed on a silicon substrate 101 by dry oxidation. The insulating film 202 is a prospective gate insulating film. In this embodiment, after a polysilicon film 203 having a thickness of about 70 nm is formed on the insulating film 202 by low-pressure CVD, a tantalum nitride film is deposited on the polysilicon film 203 by sputtering, and a TaN film 1201 having a thickness of about 10 nm is formed thereon. A silicon nitride film 204 having a thickness of about 100 nm is formed on the TaN film 1201 by low-pressure CVD.

Figure 5B:
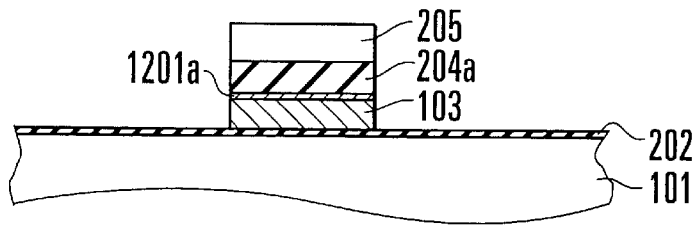

Next, as shown in FIG. 5B, the silicon nitride film 204, TaN film 1201, and polysilicon film 203 are selectively removed by dry etching using a resist pattern 205 as a mask to form a lower gate electrode 103 and sacrificial pattern 204a, and also a barrier film (first barrier film) 1201a sandwiched therebetween.

Figure 5C:
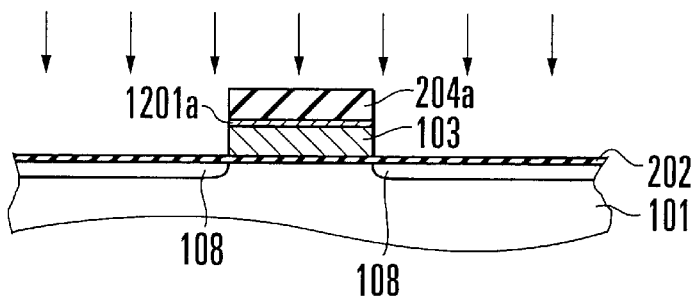

After the resist pattern 205 is removed, as shown in FIG. 5C, ions are selectively implanted using the sacrificial pattern 204a and lower gate electrode 103 as a mask to form a lightly doped impurity region (LDD) 108. In this case as well, As ions are implanted at an acceleration energy of 20 eV and a dose of about $3 \times 10^{13}$ cm$^{-2}$.

Figure 5D:
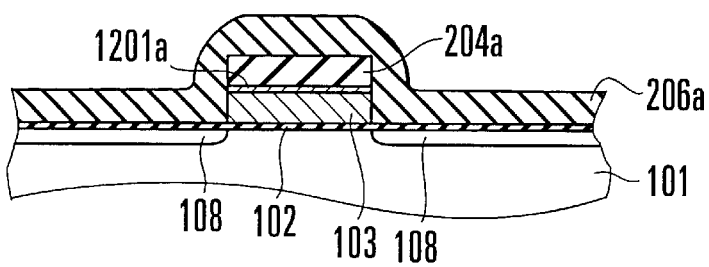

As shown in FIG. 5D, a silicon nitride film 206a is formed on the entire surface.

Figure 5E:
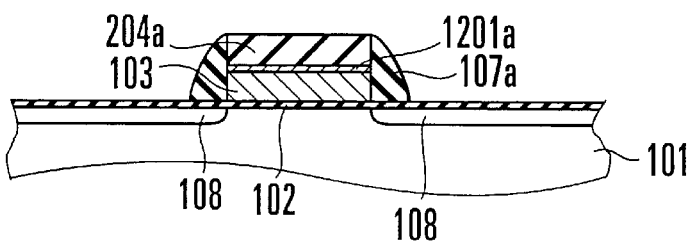

The silicon nitride film 206a is etched back by reactive ion etching (RIE) having vertical anisotropy to form a side wall 107a on the side surfaces of the lower gate electrode 103, barrier film 1201a, and sacrificial pattern 204a, as shown in FIG. 5E. The side wall 107a is formed from silicon nitride and therefore can be used as a second barrier film for suppressing diffusion of copper.

Figure 5F:
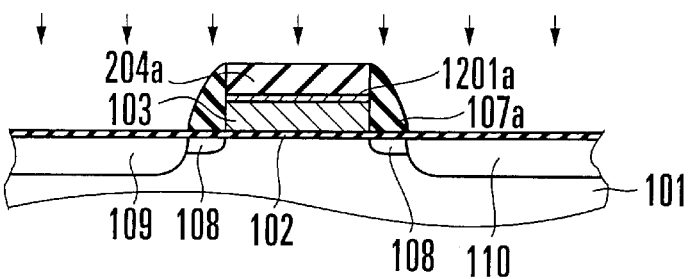

Next, as shown in FIG. 5F, ions are selectively implanted using the sacrificial pattern 204a, lower gate electrode 103, and side wall 107a as a mask to form a source 109 and drain 110. In this case, As ions are implanted at an acceleration energy of 30 eV and a dose of about $3 \times 10^{15}$ cm$^{-2}$.

Figure 5G:
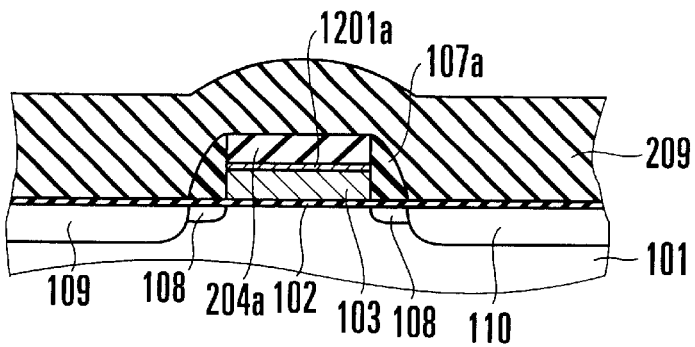

Borophosphosilicate glass is deposited by CVD using ozone and TEOS as source gases to form a lower interlayer insulating film 209 having a thickness of about 500 nm, as shown in FIG. 5G.

Figure 5H:
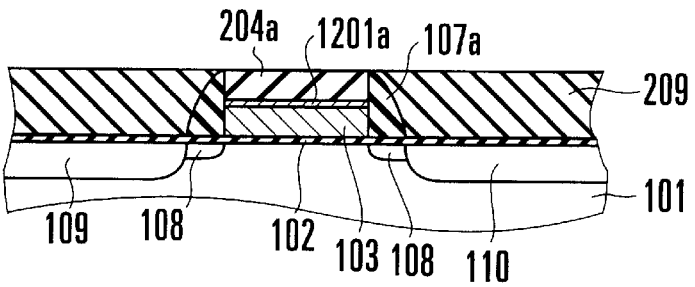

The lower interlayer insulating film 209 is planarized by oxide film CMP (Chemical Mechanical Polishing) to expose the upper surface of the sacrificial pattern 204a, as shown in FIG. 5H.

Figure 5I:
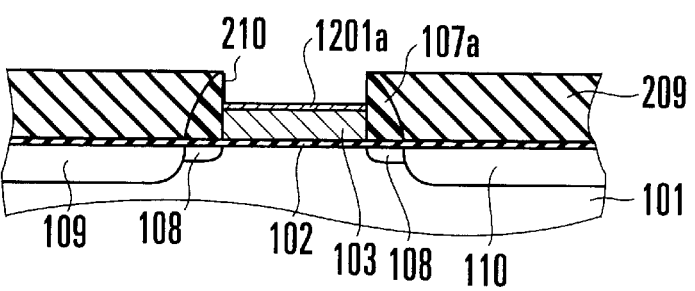

The sacrificial pattern 204a is selectively removed under a condition for selectively etching silicon oxide to form a trench 210 surrounded by the side wall 107a and lower interlayer insulating film 209 on the lower gate electrode 103 having an upper surface covered with the barrier film 1201a, as shown in FIG. 5I.

Figure 5J:
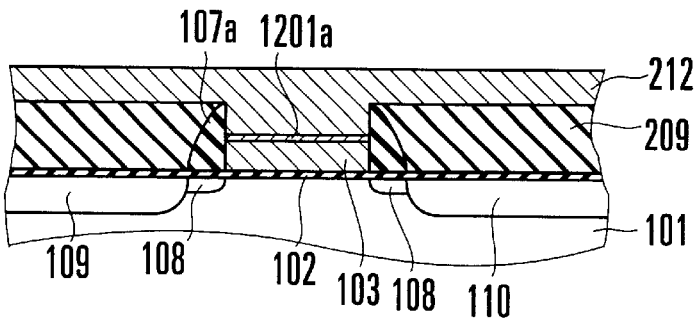
Figure 5K:
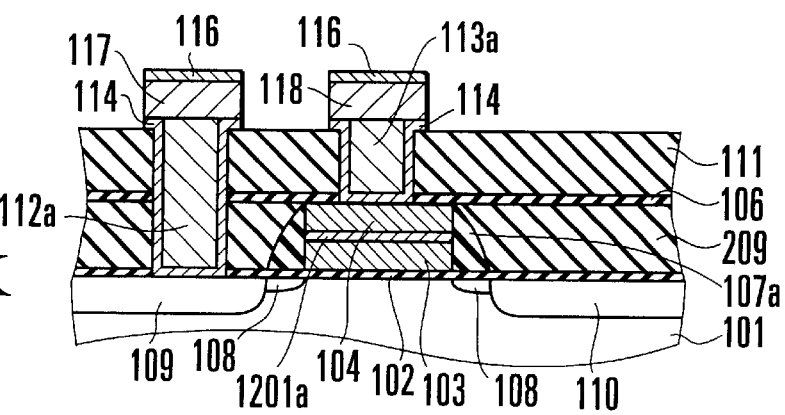
Figure 6:
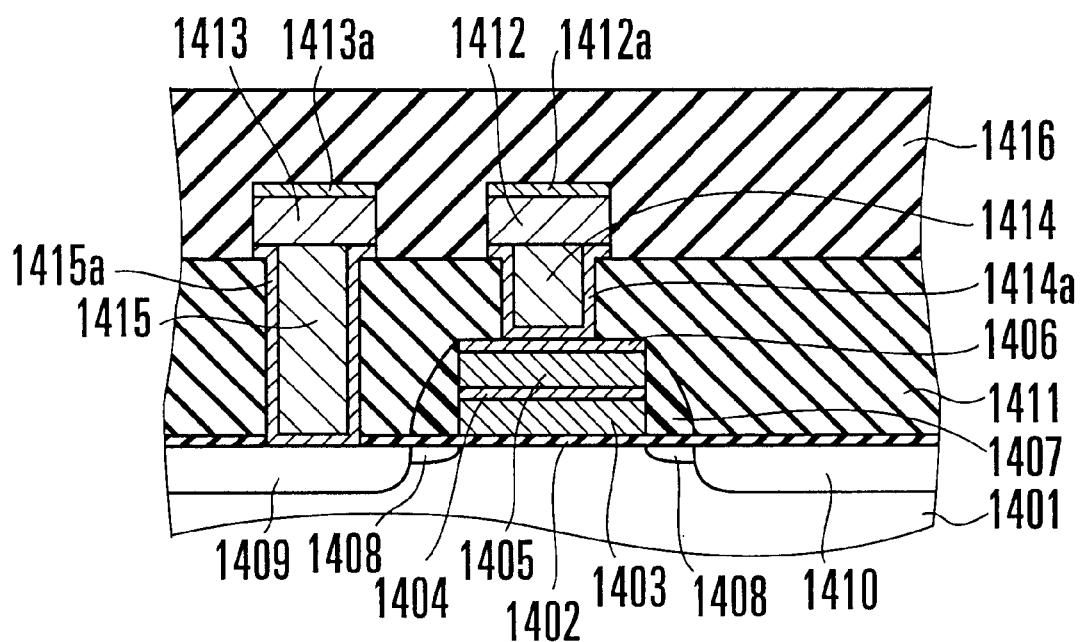
FIG. 6 is a sectional view showing the structure of a conventional field effect transistor.

As shown in FIG. 5J, copper is deposited on the lower interlayer insulating film 209 (barrier film 1201a), including the bottom portion of the trench 210, by sputtering to form a Cu layer 212 having a thickness of about 200 nm.

After this, the same processes as in FIGS. 2K to 2Q are performed. For example, the Cu layer 212 is removed by, e.g., metal film CMP to complete a field effect transistor in which the side wall 107a is used as the second barrier film, as shown in FIG. 5R.

After formation of the TaN film 1201, a thin silicon oxide film may be formed before formation of the polysilicon film to form an etching stopper layer of silicon oxide between the barrier film (first barrier film) 1201a and the sacrificial pattern 705a. With this etching stopper layer, the sacrificial pattern 705a can be more easily selectively removed. The etching stopper layer can be selectively removed from the barrier film or side wall by, e.g., wet etching using hydrofluoric acid. In this case, the lower interlayer insulating film 209 is also etched to some extent.

With the above-described method, the upper gate electrode can be formed to the same width as that of the lower gate electrode. For this reason, the width of the upper gate electrode becomes larger than that of the first embodiment, and the resistance of the upper gate electrode decreases.

As has been described above, according to the present invention, a field effect transistor comprises a lower gate electrode formed from silicon on a silicon substrate via a gate insulating film, an upper gate electrode formed from copper above the lower gate electrode, a first barrier film having a conductivity capable of supplying to the lower gate electrode a current enough to drive a channel portion and formed to cover a lower surface of the upper gate electrode and impede diffusion of copper, a second barrier film having a lower end in contact with the first barrier film and formed to cover side surfaces of the upper gate electrode and impede diffusion of copper, a third barrier film having an end portion in contact with the second barrier film and formed to cover an upper surface of the upper gate electrode and impede diffusion of copper, and a source and drain formed in the silicon substrate to sandwich a region under the lower gate electrode.

The upper gate electrode is in contact with the remaining portions of the field effect transistor via the first to third barrier films. That is, diffusion of copper from the upper gate electrode can be impeded in any directions. As the excellent effect of the present invention, copper can be used as the material of the gate electrode of the field effect transistor without degrading the characteristics of the transistor.

According to the present invention, a method of manufacturing a field effect transistor comprises at least the steps of forming a gate insulating film on a silicon substrate, forming a lower gate electrode of silicon on the gate insulating film, forming a sacrificial pattern on the lower gate electrode, doping an impurity into a predetermined region of the silicon substrate using the lower gate electrode and the sacrificial pattern as a mask to form a source and drain, forming a first interlayer insulating film of silicon oxide on the silicon substrate so as to cover the lower gate electrode and the sacrificial pattern, removing the first interlayer insulating film to expose an upper surface of the sacrificial pattern, selectively removing only the sacrificial pattern to expose an upper surface of the lower gate electrode and form a trench in the first interlayer insulating film on the lower gate electrode, forming first and second barrier films having a conductivity for impeding diffusion of copper so as to cover the upper surface of the lower gate electrode and side surfaces of the trench, forming an upper gate electrode of copper in the trench via the first and second barrier films such that bottom and side surfaces of the upper gate electrode are covered with the first and second barrier films, and forming a third barrier film for impeding diffusion of copper so as to cover an exposed upper surface of the upper gate electrode.

According to the present invention, a method of manufacturing a field effect transistor comprises at least the steps of forming a gate insulating film on a silicon substrate, forming a lower gate electrode of silicon on the gate insulating film, forming an etching stopper layer on the lower gate electrode, forming a sacrificial pattern on the etching stopper layer, doping an impurity into a predetermined region of the silicon substrate using the lower gate electrode and the sacrificial pattern as a mask to form a source and drain, forming a first interlayer insulating film of silicon oxide on the silicon substrate so as to cover the lower gate electrode and the sacrificial pattern, selectively removing the first interlayer insulating film to expose an upper surface of the sacrificial pattern and form a trench on the lower gate electrode, selectively removing the sacrificial pattern to expose an upper surface of the etching stopper layer, removing the etching stopper layer to expose an upper surface of the lower gate electrode, forming first and second barrier films having a conductivity for impeding diffusion of copper so as to cover the upper surface of the lower gate electrode and side surfaces of the trench, forming an upper gate electrode of copper in the trench via the first and second barrier films such that bottom and side surfaces of the upper gate electrode are covered with the first and second barrier films, and forming a third barrier film for impeding diffusion of copper so as to cover an exposed upper surface of the upper gate electrode.

With the above manufacturing method, the upper gate electrode is formed in contact with the remaining portions of the field effect transistor via the first to third barrier films. That is, diffusion of copper from the upper gate electrode can be impeded in any directions. As the excellent effect of the present invention, copper can be used as the material of the gate electrode of the field effect transistor without degrading the characteristics of the transistor.

In addition, the upper gate electrode of copper is formed after formation of the source and drain. That is, the upper gate electrode is formed after the high-temperature annealing for activation for forming the source and drain. As a result, the upper gate electrode can be formed using copper with a relatively low melting point.

According to the present invention, a method of manufacturing a field effect transistor comprises at least the steps of forming a gate insulating film on a silicon substrate, forming a lower gate electrode of silicon on the gate insulating film, forming a sacrificial pattern on the lower gate electrode, doping an impurity into a predetermined region of the silicon substrate using the lower gate electrode and the sacrificial pattern as a mask to form a source and drain, forming a side wall of an insulating material for impeding diffusion of copper on side surfaces of the lower gate electrode and the sacrificial pattern, forming a first interlayer insulating film of silicon oxide on the silicon substrate so as to cover the lower gate electrode and the sacrificial pattern, removing the first interlayer insulating film to expose an upper surface of the sacrificial pattern, selectively removing the sacrificial pattern to form a trench on the lower gate electrode, forming a first barrier film having a conductivity for impeding diffusion of copper so as to cover the upper surface of the lower gate electrode and make two ends of the first barrier film in contact with the side wall, forming an upper gate electrode of copper in the trench via the first barrier film so that a bottom surface of the upper gate electrode is covered with the first barrier film and two side surfaces of the upper gate electrode are covered with a second barrier film formed from the side wall, and forming a third barrier film for impeding diffusion of copper so as to cover an exposed upper surface of the upper gate electrode.

According to the present invention, a method of manufacturing a field effect transistor comprises at least the steps of forming a gate insulating film on a silicon substrate, forming a lower gate electrode of silicon on the gate insulating film, forming an etching stopper layer on the lower gate electrode, forming a sacrificial pattern on the etching stopper layer, doping an impurity into a predetermined region of the silicon substrate using the lower gate electrode and the sacrificial pattern as a mask to form a source and drain, forming a side wall of an insulating material for impeding diffusion of copper on two side surfaces of the lower gate electrode, the etching stopper layer, and the sacrificial pattern, forming a first interlayer insulating film of silicon oxide on the silicon substrate so as to cover the lower gate electrode, the etching stopper layer, and the sacrificial pattern, removing the first interlayer insulating film to expose an upper surface of the sacrificial pattern, selectively removing the sacrificial pattern to expose an upper surface of the etching stopper layer, removing the etching stopper layer to form a trench on the lower gate electrode, forming a first barrier film having a conductivity for impeding diffusion of copper so as to cover in contact with the upper surface of the lower gate electrode and make two ends of the first barrier film in contact with the side wall, forming an upper gate electrode of copper in the trench via the first barrier film so that a bottom surface of the upper gate electrode is covered with the first barrier film and two side surfaces of the upper gate electrode are covered with a second barrier film formed from the side wall, and forming a third barrier film for impeding diffusion of copper so as to cover an exposed upper surface of the upper gate electrode.

According to the present invention, a method of manufacturing a field effect transistor comprises at least the steps of forming a gate insulating film on a silicon substrate, forming a lower gate electrode of silicon on the gate insulating film, forming an etching stopper layer on the lower gate electrode, forming a sacrificial pattern on the etching stopper layer, doping an impurity into a predetermined region of the silicon substrate using the lower gate electrode and the sacrificial pattern as a mask to form a source and drain, forming a side wall of an insulating material for impeding diffusion of copper on two side surfaces of the lower gate electrode, the etching stopper layer, and the sacrificial pattern, forming a first interlayer insulating film of silicon oxide on the silicon substrate so as to cover the lower gate electrode, the etching stopper layer, and the sacrificial pattern, selectively removing the first interlayer insulating film to expose an upper surface of the sacrificial pattern and form a trench on the lower gate electrode, selectively removing the sacrificial pattern to expose an upper surface of the etching stopper layer, removing the etching stopper layer, forming a first barrier film having a conductivity for impeding diffusion of copper so as to cover in contact with the upper surface of the lower gate electrode and make two ends of the first barrier film in contact with the side wall, forming an upper gate electrode of copper in the trench via the first barrier film so that a bottom surface of the upper gate electrode is covered with the first barrier film and two side surfaces of the upper gate electrode are covered with a second barrier film formed from the side wall, and forming a third barrier film for impeding diffusion of copper so as to cover an exposed upper surface of the upper gate electrode.

With the above manufacturing method, the upper gate electrode is formed in contact with the remaining portions of the field effect transistor via the first to third barrier films. That is, diffusion of copper from the upper gate electrode can be impeded in any directions. As the excellent effect of the present invention, copper can be used as the material of the gate electrode of the field effect transistor without degrading the characteristics of the transistor.

In addition, since the side wall also serves as the second barrier film, the processes can be simplified.

Furthermore, the upper gate electrode of copper is formed after formation of the source and drain. That is, the upper gate electrode is formed after the high-temperature annealing for activation for forming the source and drain. As a result, the upper gate electrode can be formed using copper with a relatively low melting point.

What is claimed is:

1. A field effect transistor comprising:

a lower gate electrode formed from silicon on a silicon substrate via a gate insulating film;

an upper gate electrode formed from copper above said lower gate electrode;

a first barrier film having a conductivity capable of supplying to said lower gate electrode a current enough to drive a channel portion and formed to cover a lower surface of said upper gate electrode and impede diffusion of copper, said first barrier film having a thickness of between about 2 nanometers and about 10 nanometers;

a second barrier film having a lower end in contact with said first barrier film and formed to cover side surfaces of said upper gate electrode and impede diffusion of copper;

a third barrier film having an end portion in contact with said second barrier film and formed to cover an upper surface of said upper gate electrode and impede diffusion of copper; and a source and drain formed in said silicon substrate to sandwich a region under said lower gate electrode, wherein said first barrier film is a multilayered film having at least two layers, wherein said first barrier film is a multilayered film in which a lowermost layer is formed from a layer of a metal silicide or a compound of a refractory metal, silicon, and nitride, and a refractory metal nitride layer is stacked on said metal silicide layer.

2. A field effect transistor comprising:

a lower gate electrode formed from silicon on a silicon substrate via a gate insulating film;

an upper gate electrode formed from copper above said lower gate electrode;

a first barrier film having a conductivity capable of supplying to said lower gate electrode a current enough to drive a channel portion and formed to cover a lower surface of said upper gate electrode and impede diffusion of copper, said first barrier film having a thickness of between about 2 nanometers and about 10 nanometers;

a second barrier film having a lower end in contact with said first barrier film and formed to cover side surfaces of said upper gate electrode and impede diffusion of copper;

a third barrier film having an end portion in contact with said second barrier film and formed to cover an upper surface of said upper gate electrode and impede diffusion of copper; and a source and drain formed in said silicon substrate to sandwich a region under said lower gate electrode, wherein said first barrier film is a multilayered film having at least two layers, wherein said first barrier film is a multilayered film in which a lowermost layer is formed from a layer of a metal silicide or a compound of a refractory metal, silicon, and nitride, a refractory metal nitride layer is stacked on said metal silicide layer, and an uppermost layer is formed from a refractory metal.

* * * * *